(12) United States Patent
Neuber

(10) Patent No.: US 11,396,699 B2
(45) Date of Patent: Jul. 26, 2022

(54) METHOD FOR CONTROLLING A PROCESSING SYSTEM

(71) Applicant: Applied Materials, Inc., Santa Clara, CA (US)

(72) Inventor: Andreas Neuber, Stuttgart (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/544,334

(22) Filed: Aug. 19, 2019

(65) Prior Publication Data

US 2019/0368037 A1 Dec. 5, 2019

Related U.S. Application Data

(63) Continuation of application No. 15/138,818, filed on Apr. 26, 2016, now Pat. No. 10,428,420.
(Continued)

(51) Int. Cl.
*C23C 16/44* (2006.01)
*C23C 16/52* (2006.01)
(Continued)

(52) U.S. Cl.
CPC .... *C23C 16/4412* (2013.01); *C23C 16/45502* (2013.01); *C23C 16/45512* (2013.01); *C23C 16/52* (2013.01); *C23C 16/54* (2013.01)

(58) Field of Classification Search
CPC .... B01D 2259/122; B01D 2259/40009; B01D 2259/40056; B01D 53/0476;
(Continued)

(56) References Cited

U.S. PATENT DOCUMENTS 4,488,506 A * 12/1984 Heinecke ............... C23C 16/44
118/666
4,608,063 A * 8/1986 Kurokawa .......... C23C 16/4412
118/50.1
(Continued)

FOREIGN PATENT DOCUMENTS

JP 60-195028 10/1985
KR 2000-0067165 A 11/2000
(Continued)

OTHER PUBLICATIONS

Abreu, et al.; Causes of anomalous solid formation in the exhaust systems of low-pressure chemical vapor deposition and plasma enhanced chemical vapor deposition semiconductor processes; J. Vac. Sci. Technol. B 12(4); dated Jul./Aug. 1994; 5 total pages.
(Continued)

*Primary Examiner* — Jeffrie R Lund
(74) *Attorney, Agent, or Firm* — Patterson + Sheridan, LLP

(57) ABSTRACT

Embodiments described herein generally relate to methods for controlling a processing system. Particularly, subfab components of the processing system may be controlled based on the flow of materials into the processing system. In some embodiments, the flow of an inert gas used to dilute the effluent gases may be controlled in accordance with the flow of one or more precursor gases. Thus, the cost of running the processing system is reduced while mitigating critical EHS concerns.

8 Claims, 2 Drawing Sheets

Related U.S. Application Data

(60) Provisional application No. 62/159,074, filed on May 8, 2015.

(51) Int. Cl.
*C23C 16/455* (2006.01)
*C23C 16/54* (2006.01)

(58) Field of Classification Search
CPC .. B01D 53/1456; B01D 53/34; B01D 53/346;
B01D 53/74; B01D 53/8659; B01F
15/00207; B01J 2219/00069; B01J
2219/00261; B01J 2219/00263; B24B
57/02; C23C 14/564; C23C 14/24; C23C
14/4405; C23C 14/4412; C23C 14/45502;
C23C 14/45512; C23C 14/45544; C23C
14/45561; C23C 14/45593; C23C 14/52;
C23C 14/54; C23C 14/56; C23C 16/4412;
C23C 16/45502; C23C 16/45512; C23C
16/52; C23C 16/54; F04B 2205/01; F04B
49/00; F04B 49/08; F04C 2220/10; F04D
19/04; F04D 27/001; F23G 7/065; F23M
5/085; G05D 11/139; H01L 21/02532;
H01L 21/67017; H01L 21/67253; H01L
22/20; H01M 4/0421; H01M 4/0423;
Y10S 438/909; Y10T 436/12
See application file for complete search history.

(56) References Cited

U.S. PATENT DOCUMENTS

| | | | |
|---|---|---|---|
| 4,619,840 A | 10/1986 | Goldman et al. | |
| 5,011,520 A * | 4/1991 | Carr | B01D 47/08 261/116 |
| 5,338,363 A | 8/1994 | Kawata et al. | |
| 5,417,934 A * | 5/1995 | Smith | B01D 53/46 422/171 |
| 5,497,316 A * | 3/1996 | Sierk | F17C 13/02 700/11 |
| 5,759,237 A * | 6/1998 | Li | B01D 53/228 95/128 |
| 5,797,195 A * | 8/1998 | Huling | B08B 7/00 34/404 |
| 5,819,683 A * | 10/1998 | Ikeda | B01D 53/72 118/724 |
| 5,826,607 A | 10/1998 | Knutson et al. | |
| 5,827,370 A * | 10/1998 | Gu | C23C 16/4412 118/715 |
| 5,851,293 A * | 12/1998 | Lane | C23C 16/4412 118/715 |
| 6,042,654 A | 3/2000 | Comita et al. | |
| 6,287,990 B1 * | 9/2001 | Cheung | C23C 16/401 257/E21.279 |
| 6,358,485 B1 * | 3/2002 | Baker | B01D 53/8668 423/245.1 |
| 6,486,081 B1 | 11/2002 | Ishikawa et al. | |
| 6,834,664 B1 * | 12/2004 | Chiang | F17D 3/12 118/715 |
| 8,539,257 B2 | 9/2013 | Schauer | |
| 10,428,420 B2 * | 10/2019 | Neuber | C23C 16/4412 |
| 2001/0017080 A1 * | 8/2001 | Dozoretz | H01J 37/32844 96/108 |
| 2002/0041931 A1 * | 4/2002 | Suntola | C23C 16/45525 427/255.28 |
| 2002/0045361 A1 * | 4/2002 | Cheung | H01L 21/76829 438/790 |
| 2002/0094380 A1 * | 7/2002 | Holst | C23C 16/18 427/255.28 |
| 2002/0134429 A1 * | 9/2002 | Kubota | G05D 7/03 137/240 |
| 2003/0098419 A1 * | 5/2003 | Ji | G01N 21/31 250/373 |
| 2003/0124859 A1 * | 7/2003 | Cheung | H01L 21/31612 438/692 |
| 2003/0198741 A1 * | 10/2003 | Uchida | C23C 16/45519 427/248.1 |
| 2004/0101460 A1 * | 5/2004 | Arno | B01D 53/70 423/210 |
| 2004/0157347 A1 * | 8/2004 | Komiyama | C23C 16/52 438/8 |
| 2004/0206237 A1 * | 10/2004 | Sherer | B01D 53/75 95/90 |
| 2005/0026434 A1 | 2/2005 | Huy et al. | |
| 2005/0059261 A1 * | 3/2005 | Basceri | C23C 16/45527 438/778 |
| 2005/0079708 A1 * | 4/2005 | Yamasaki | C23C 16/16 438/680 |
| 2006/0065120 A1 * | 3/2006 | Clements | B01D 53/68 95/233 |
| 2006/0104878 A1 * | 5/2006 | Chiu | F23N 5/242 423/240 R |
| 2006/0278162 A1 | 12/2006 | Ohmi et al. | |
| 2007/0086931 A1 * | 4/2007 | Raoux | B01D 53/8678 422/168 |
| 2007/0108113 A1 * | 5/2007 | Urquhart | F04C 19/001 210/198.1 |
| 2007/0109912 A1 * | 5/2007 | Urquhart | H01L 21/67017 366/136 |
| 2007/0110591 A1 * | 5/2007 | Urquhart | F04C 19/001 417/295 |
| 2007/0119816 A1 * | 5/2007 | Urquhart | H01L 21/67253 216/84 |
| 2007/0183909 A1 * | 8/2007 | Kusay | F04C 28/28 417/422 |
| 2007/0194470 A1 | 8/2007 | Dedontney | |
| 2008/0024762 A1 * | 1/2008 | Fang | G01N 21/65 356/72 |
| 2008/0072585 A1 * | 3/2008 | Ikeda | C23C 16/4412 60/324 |
| 2008/0083673 A1 * | 4/2008 | Golden | C25D 21/22 210/669 |
| 2008/0261116 A1 | 10/2008 | Burton et al. | |
| 2009/0018688 A1 * | 1/2009 | Chandler | B01D 53/346 700/105 |
| 2009/0141583 A1 * | 6/2009 | Fanjat | H01L 21/67253 366/140 |
| 2009/0216061 A1 * | 8/2009 | Clark | B01D 53/40 588/313 |
| 2009/0238972 A1 * | 9/2009 | Clark | C23C 16/4402 427/255.28 |
| 2009/0246105 A1 * | 10/2009 | Clark | C23C 14/56 423/219 |
| 2010/0008838 A1 * | 1/2010 | Fox | G05D 21/02 423/240 R |
| 2010/0096110 A1 * | 4/2010 | Neuber | H01L 21/67017 165/104.19 |
| 2010/0224264 A1 * | 9/2010 | Homan | H01L 21/2225 137/93 |
| 2010/0258510 A1 * | 10/2010 | Hooshdaran | B01D 53/68 210/749 |
| 2010/0298738 A1 * | 11/2010 | Felts | B65D 25/14 600/576 |
| 2011/0011129 A1 * | 1/2011 | Briend | C23C 16/45593 62/617 |
| 2011/0139272 A1 * | 6/2011 | Matsumoto | C23C 16/448 137/511 |
| 2011/0203310 A1 * | 8/2011 | Gomi | C23C 16/4412 62/601 |
| 2011/0220342 A1 * | 9/2011 | Page | G05D 23/1917 165/279 |
| 2011/0252899 A1 * | 10/2011 | Felts | G01N 15/082 73/865.8 |
| 2011/0259366 A1 * | 10/2011 | Sweeney | C23C 14/48 134/10 |

(56) References Cited

U.S. PATENT DOCUMENTS

| | | | | |
|---|---|---|---|---|
| 2011/0311725 | A1* | 12/2011 | Sneh | C23C 16/18 427/250 |
| 2012/0204965 | A1 | 8/2012 | Loldj et al. | |
| 2012/0273052 | A1* | 11/2012 | Ye | C23C 16/45512 137/3 |
| 2013/0008311 | A1* | 1/2013 | Ohuchi | C01B 3/503 96/4 |
| 2013/0139690 | A1* | 6/2013 | Ohuchi | B01D 53/75 96/4 |
| 2013/0171919 | A1* | 7/2013 | Shinohara | B01D 53/005 454/49 |
| 2013/0317640 | A1* | 11/2013 | Lee | F04D 19/04 700/121 |
| 2014/0080071 | A1* | 3/2014 | Koss | F23G 7/061 431/5 |
| 2014/0338600 | A1* | 11/2014 | Lee | C23C 16/4412 118/722 |
| 2014/0352820 | A1* | 12/2014 | Nakazawa | B01D 53/74 137/565.01 |
| 2015/0368794 | A1* | 12/2015 | Morita | C23C 16/4405 156/345.24 |
| 2016/0059185 | A1* | 3/2016 | Naito | B01D 53/346 422/105 |
| 2016/0281223 | A1* | 9/2016 | Sowa | H01J 37/32834 |
| 2016/0326643 | A1* | 11/2016 | Neuber | C23C 16/45512 |
| 2018/0073137 | A1* | 3/2018 | Xavier | C23C 16/4408 |
| 2019/0368037 | A1* | 12/2019 | Neuber | G05D 23/1917 165/279 |

FOREIGN PATENT DOCUMENTS

| | | | | |
|---|---|---|---|---|
| KR | 2007-0036249 | A | | 4/2007 |
| KR | 20070036249 | A | * | 4/2007 ............... G05D 7/00 |
| KR | 10-1383985 | B1 | | 4/2014 |
| WO | WO-2015041102 | A1 | * | 3/2015 ............... F23J 15/04 |

OTHER PUBLICATIONS

Choo, et al.; Spatially controllabe chemical vapor deposition; dated Dec. 2, 2003; 34 total pages.

Chandler, et al.; Solid State Technology; Insights for Electronics Manufacturing; Subfab Sync Increases Energy Savings; dated Apr. 1, 2010; 4 total pages.

McIntosh; Maintaining Abatement Efficiency While Increasing Utility Efficiency Using the Applied iSYS™ Controller dated 2013; 4 total pages.

Anand, et al.; Applied Physics Letters 107; Atmospheric pressure plasma chemical vapor deposition reactor for 100 mm wafers, optimized for minimum contamination at low gas flow rates; dated 2015; 5 total pages.

PCT Notification of Transmittal of the International Search Report and the Written Opinion of the International Searching Authority for International Application No. PCT/US2016/026327; dated Jul. 27, 2016; 12 total pages.

Office Action for Taiwan Application No. 109121454 dated Apr. 27, 2021.

Taiwanese Office Action (with attached English translation) for Application No. 105111240; dated Sep. 9, 2019 7 total pages.

* cited by examiner

METHOD FOR CONTROLLING A PROCESSING SYSTEM

CROSS-REFERENCE TO RELATED APPLICATIONS

This application is a continuation application of co-pending U.S. patent application Ser. No. 15/138,818, filed on Apr. 26, 2016, which claims benefit of U.S. Provisional Patent Application Ser. No. 62/159,074, filed on May 8, 2015. Each of afore mentioned patent applications are incorporated herein by reference.

BACKGROUND

Field

Embodiments described herein generally relate to the manufacture of electronic devices, and more particularly, to methods for controlling a processing system.

Description of the Related Art

The manufacture of electronic devices by a processing system typically results in the creation of byproduct effluent gases. These effluent gases may contain undesirable species which may be harmful and/or hazardous. The concentration of the undesirable species in the effluent gases may be diluted, and the dilution is typically performed by subfab components, such as vacuum pumps, point-of-use (POU) abatement and heat removal devices. The subfab components are typically designed to manage worst-case risk scenarios in order to mitigate critical environmental, health and safety (EHS) concerns. As such, many subfab components may be operating continuously with virtually no downtime.

Therefore, an improved method for operating the subfab components is needed.

SUMMARY

Embodiments described herein generally relate to methods for controlling a processing system. In one embodiment, a method includes flowing a precursor gas into a processing chamber, flowing an inert gas into an exhaust line coupled to the processing chamber, and controlling the flow of the inert gas based on the flow of the precursor gas.

In another embodiment, a method includes flowing a precursor gas into a processing chamber at a first flow rate, flowing an inert gas into an exhaust line coupled to the processing chamber at a second flow rate, changing the first flow rate to a third flow rate, and changing the second flow rate to a fourth flow rate based on the changing of the first flow rate to the third flow rate.

In another embodiment, a method includes flowing a precursor gas into a processing chamber, flowing a coolant to an abatement system downstream of the processing chamber, and controlling the flowing of the coolant based on the flowing of the precursor gas.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to methods for controlling a processing system. Particularly, subfab components of the processing system may be controlled based on the flow of materials into the processing system. In some embodiments, the flow of an inert gas used to dilute the effluent gases may be controlled in accordance with the flow of one or more precursor gases. Thus, the cost of running the processing system is reduced while mitigating critical EHS concerns.

In one embodiment, a method includes flowing a precursor gas into a processing chamber, flowing an inert gas into an exhaust line coupled to the processing chamber, and controlling the flow of the inert gas based on the flow of the precursor gas.

In another embodiment, a method includes flowing a precursor gas into a processing chamber at a first flow rate, flowing an inert gas into an exhaust line coupled to the processing chamber at a second flow rate, changing the first flow rate to a third flow rate, and changing the second flow rate to a fourth flow rate based on the changing of the first flow rate to the third flow rate.

In another embodiment, a method includes flowing a precursor gas into a processing chamber, flowing a coolant to an abatement system downstream of the processing chamber, and controlling the flowing of the coolant based on the flowing of the precursor gas.

Figure 1:
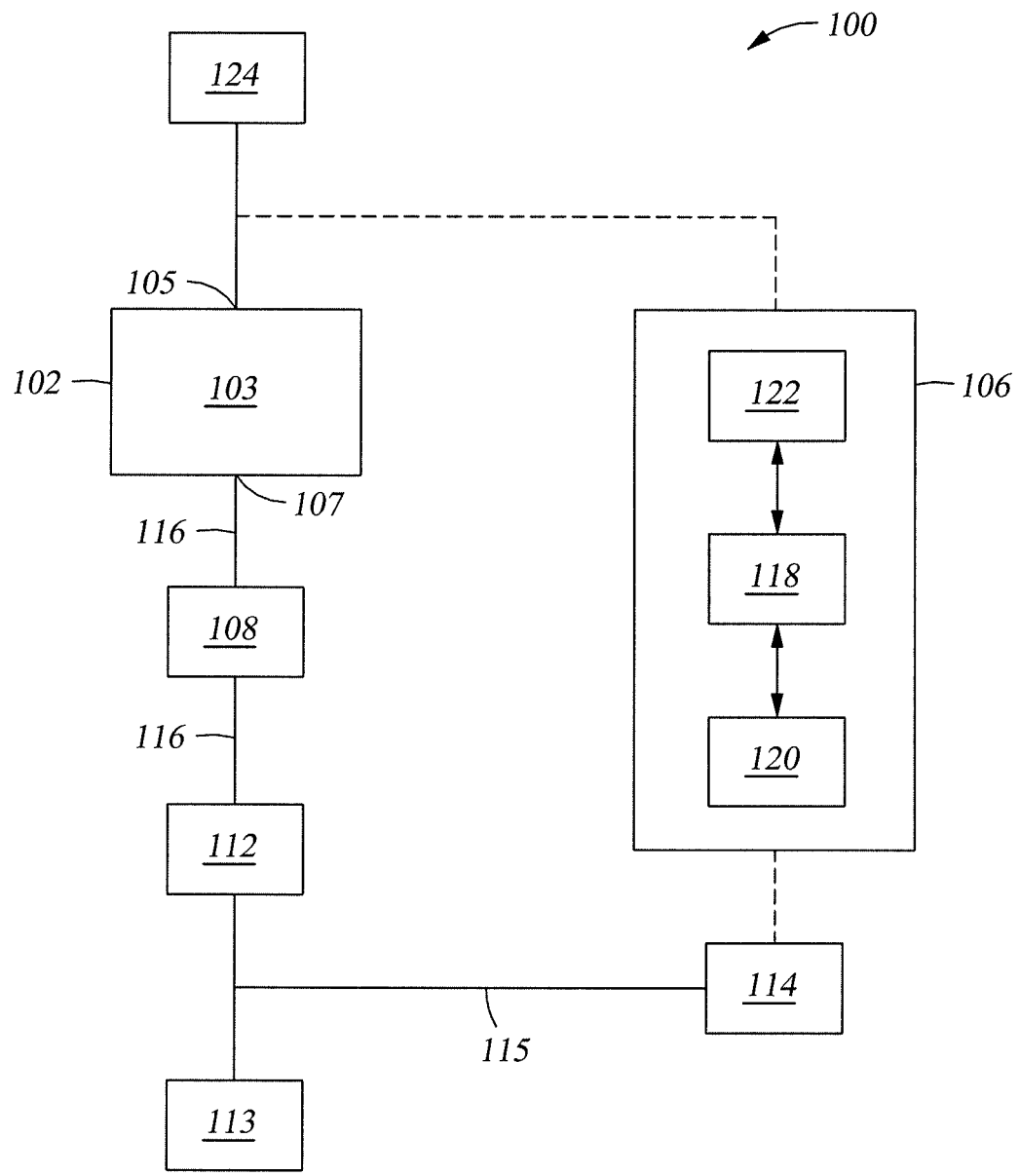
FIG. 1 schematically illustrates a processing system according to one embodiment.

FIG. 1 schematically illustrates a processing system 100 according to one embodiment. As shown in FIG. 1, the processing system 100 may generally include a processing chamber 102 having an interior processing volume 103, one or more gas inlets 105 coupled to one or more gas sources 124, and an outlet 107 coupled to a vacuum pump 112 via an exhaust line 116. The one or more gas sources 124 may provide one or more gases to the processing chamber 102, such as precursor gases, cleaning gases, etching gases, purge gases, or the like. The vacuum pump 112 is generally used to remove materials such as effluent gases from the processing chamber 102. The vacuum pump 112, in combination with a valve 108 disposed in the exhaust line 116, can also be used to control the pressure in the processing chamber 102.

A subfab component, such as a pump 114, may be utilized to pump an inert gas, such as nitrogen gas, into the exhaust line 116 via a conduit 115 in order to dilute the effluent gases. The diluted effluent gases may be fed into an abatement system 113 downstream of the processing chamber 102. Conventionally, the pump 114 is operated continuously and the flow of the inert gas is set at a maximum value. The dilution of the effluent gases reduces the risk that accidental leaks will result in a pyrophoric reaction. However, large flows of inert gases call for more abatement energy to process the diluted effluent gases. In order to reduce the cost of operating the subfab components and to abate the effluent gases more efficiently, a controller 106 may be utilized.

The controller 106 may be coupled to receive a flow rate or flow rates from the one or more gas sources 124 or a mass flow controller (not shown) located in the conduit between the one or more gas sources 124 and the processing chamber 102. The controller 106 may be also coupled to send set points to the subfab components, such as the pump 114. The subfab components, such as the pump 114, may be controlled by the controller 106 based on the flow of the gases from the one or more gas sources 124 into the processing chamber 102. In one embodiment, the flow of an inert gas used to dilute the effluent gases may be controlled in accordance with the flow of one or more precursor gases into the processing chamber 102. In some embodiments, PID type algorithms may be utilized to control the flow of the inert gas used to dilute the effluent gases based on the flow of one or more precursor gases. For example, the flow of the inert gas may be set in proportion to the flow of the precursor gases. In one embodiment, a silane based precursor gas is flowed into the processing chamber 102 from the gas source 124. Because the harmful or hazardous species in the effluent gases are produced as a result of having the silane based precursor gas, the flow of the silane based precursor gas may be used to control the subfab components. During processing, the silane based precursor gas may be flowed into the processing chamber 102 at a first flow rate, which is sent to the controller 106. The controller 106 may signal the pump 114 to inject an inert gas, such as nitrogen gas, into the exhaust line 116 via the conduit 115 at a second flow rate based on the first flow rate of the silane based precursor gas. If the flow rate of the silane based precursor gas is increased or decreased, the flow rate of the inert gas pumped into the exhaust line 116 may be adjusted accordingly by the controller via the pump 114, for example in proportion to the flow rate of the silane based precursor gas. For example, if the flow rate of the silane based precursor gas is decreased, the flow rate of the inert gas is also decreased. In addition, if the flow of the silane based precursor gas into the processing chamber 102 is paused, the flow of the inert gas into the exhaust line 116 may be also stopped. By varying the flow rate of the inert gas into the exhaust line 116 based on the flow rate of the silane based precursor gas, the cost of operating the subfab components, such as the pump 114, is reduced. Additionally, the efficiency of abating the diluted effluent gases is improved.

It should be noted that in an embodiment wherein the flow rate of inert gas is controlled in proportion to the flow rate of a precursor gas, such as the silane based precursor gas above, the proportionality may be dynamically adjusted based on process requirements. For example, at very low flow rates of the silane based precursor, the proportionality of the inert gas flow rate may be reduced, and at high flow rates of the silane based precursor, the proportionality of the inert gas flow rate may be increased. In this way, flow rate of the inert gas may be controlled in proportion to the flow rate of the precursor gas, but the flow rate of the inert gas may increase faster than the flow rate of the precursor gas to mitigate the increased risk associated with increased flow rates of precursor gases.

In some cases, the flow rate of inert gas may be based on flow rates of more than one precursor gas. For example, a first flow rate may be determined based on a flow rate of a first precursor, a second flow rate may be determined based on a flow rate of a second precursor, and the flow rate of inert gas may be determined by a combination of the first flow rate and the second flow rate. The first flow rate may be determined in proportion to the flow rate of the first precursor, or by any combination of proportional, integral, or derivative control. The second flow rate may likewise be determined in proportion to the flow rate of the second precursor, or by any combination of proportional, integral, or derivative control. The combination of the first flow rate and the second flow rate may be simple addition, or may be linear or non-linear combination that reflects, for example, different levels of risk associated with the different precursors. If the first precursor has a higher level of risk than the second precursor, that higher level of risk may be reflected by a different proportionality constant for determining the first flow rate and the second flow rate, or by a linear or non-linear combination that weighs the risk of the first precursor more than that of the second precursor.

The controller 106 may include a central processing unit (CPU) 118, a memory 120, and support circuits 122 for the CPU 118. The memory 120 may be one or more of readily available memory such as random access memory (RAM), read only memory (ROM), floppy disk, hard disk, flash, or any other form of digital storage, local or remote. The support circuits 122 are coupled to the CPU 118 for supporting the CPU 118. The support circuits 122 may include cache, power supplies, clock circuits, input/output circuitry and subsystems, and the like.

Figure 2:
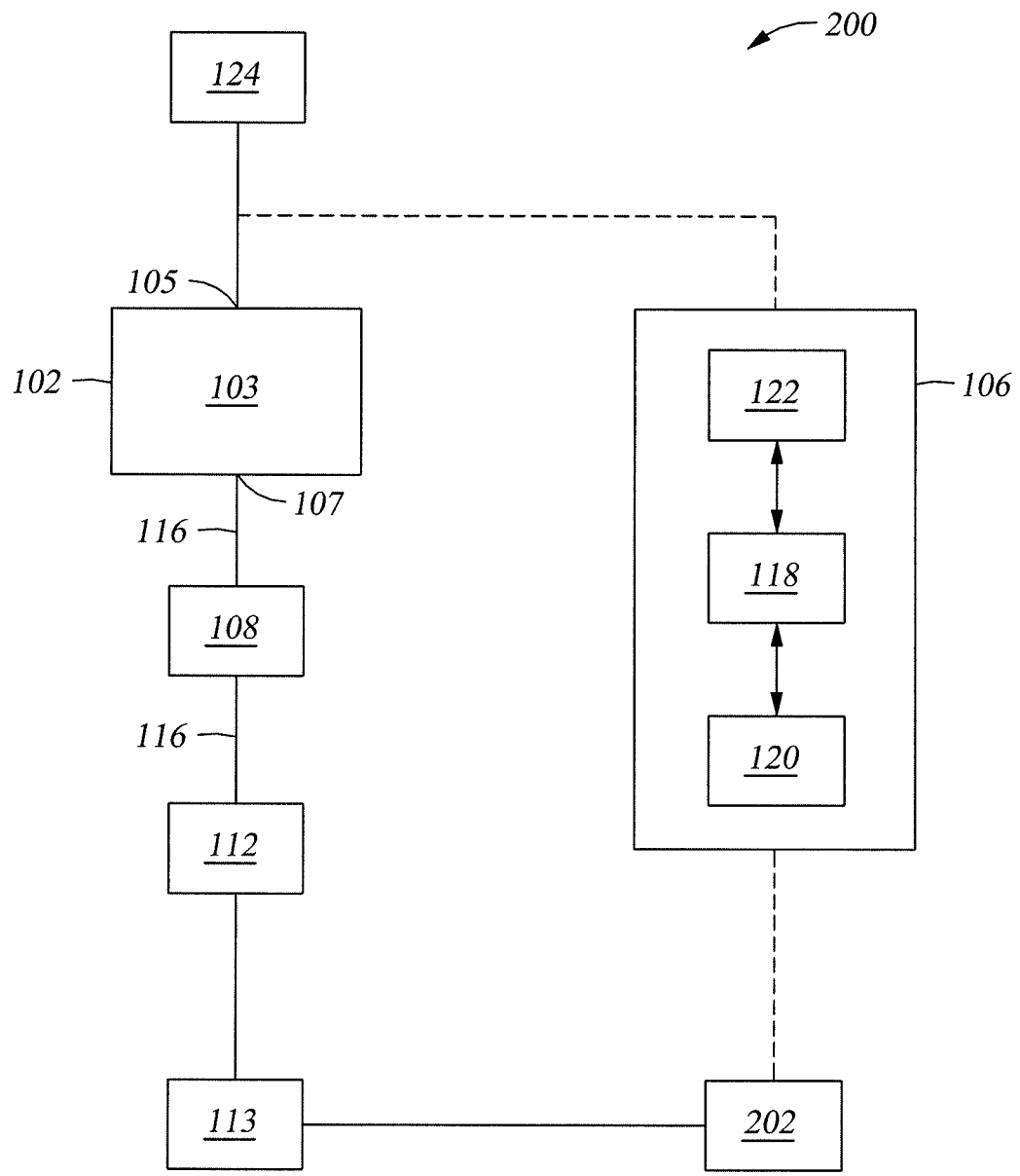
FIG. 2 schematically illustrates a processing system according to another embodiment.

FIG. 2 schematically illustrates a processing system 200 according to one embodiment. As shown in FIG. 2, a pump 202 may be coupled to the abatement system 113 in order to pump a coolant, such as water, to the abatement system 113 downstream of the processing chamber 102. Again, conventionally the coolant may flow continuously at a maximum flow rate within the abatement system 113 to provide cooling of the abatement system 113. In order to reduce the cost of operating the pump 202, the controller 106 is electrically coupled to the pump 202 to control the flow rate of the coolant based on the flow of the gases from the one or more gas sources 124 into the processing chamber 102. The controller 106 may control the pump 202 using similar methods as for controlling the pump 114. For example, if the flow rate of the gas or gases flowing into the processing chamber 102 is decreased, the flow rate of the coolant to the abatement system 113 is also decreased. In some embodiments, the pump 114 (FIG. 1) is included in the processing system 200, and the pump 114 may be controlled by the controller 106, as described in FIG. 1.

In addition to the pumps 114, 202, the controller 106 may additionally control other subfab components, such as pump for an air handling system that generates compressed air, based on the flow of the gas or gases into the processing chamber. Thus, the subfab components that are controlled by the controller are operated more efficiently and at a lower cost.

While the foregoing is directed to embodiments, other and further embodiments may be devised without departing from the basic scope thereof, and the scope thereof is determined by the claims that follow.

The invention claimed is:

1. An apparatus for controlling a processing system, comprising:
    a controller configured to:
        receive a metric indicative of a first flow rate of a first gas flowing into a processing chamber and a second flow rate of a second gas flowing into the processing chamber; and in response to the received metric, send a signal to a subfab component to inject an inert gas directly into an exhaust line at a location between the processing chamber and an abatement system downstream of the processing chamber.

2. The apparatus of claim 1, wherein the metric indicates a combination of the first flow rate and the second flow rate.

3. The apparatus of claim 2, wherein the combination of the first flow rate and the second flow rate is a linear combination.

4. The apparatus of claim 2, wherein the combination of the first flow rate and the second flow rate is a non-linear combination.

5. The apparatus of claim 1, wherein the controller is further configured to:
   determine a change in the first flow rate of the first gas and/or the second flow rate of the second gas flowing into the processing chamber; and
   change a flow rate of the inert gas injected directly into the exhaust line by the subfab component in response to a change in the flow rate.

6. The apparatus of claim 5, wherein the change in flow rate of inert gas is in proportion to the change in the first flow rate of the first gas and/or the second flow rate of the second gas flowing into the processing chamber.

7. The apparatus of claim 6, wherein a proportionality of the flow rate of the inert gas to the first flow rate of the first gas and/or the second flow rate of the second gas flowing into the processing chamber is dynamically adjusted.

8. The apparatus of claim 1, wherein the subfab component is a pump.

* * * * *